Feb. 13, 1962 H. F. REDGRIFT 3,020,635

SOLDERING METHODS

Filed May 31, 1956

INVENTOR
HARRY F. REDGRIFT

BY Elmer J. Gorn
ATTORNEY 3,020,635

SOLDERING METHODS

Harry F. Redgrift, Norwood, Mass., assignor to Raytheon Company, a corporation of Delaware Filed May 31, 1956, Ser. No. 588,487
7 Claims. (Cl. 29—495)

This invention relates generally to the fabrication of semiconductive devices and more particularly to a novel method of attaching conducting leads to these devices.

In the manufacture of semiconductive devices, a critical area in the construction process resides in the attachment of electrical conductors to the impurity material fused to the semiconductor chip. The usual method of making this connection is to attach the leads to the impurity material through the medium of a solder joint. However, considerable difficulty has been encountered in providing a joint which is both mechanically strong and yet does not impair the electrical characteristics of the device due to the detrimental effect of the solder making undesirable contact with the semiconductor body. The greatest problem in this respect has been the inability of known fluxing agents to properly prepare the surfaces of the materials to be soldered without also impairing the electrical properties of the semiconductor surface, thereby causing an inordinate number of defective units to result from the production process.

In accordance with the present invention, a novel system of lead attachment has been evolved which allows quick and mechanically strong connections to be made to the impurity dots without allowing the solder used to contaminate the surface of the semiconductor chip. Briefly, this desirable result is accomplished by utilizing a fluxing solution which wets the lead and the impurity material fused to the semiconductor body, but does not wet the surface of the semiconductor body itself. Thus, with the subsequent application of a suitable solder, the solder adheres only to the lead and the impurity material and does not attach itself to the surface of the semiconductor chip.

Figure 1:
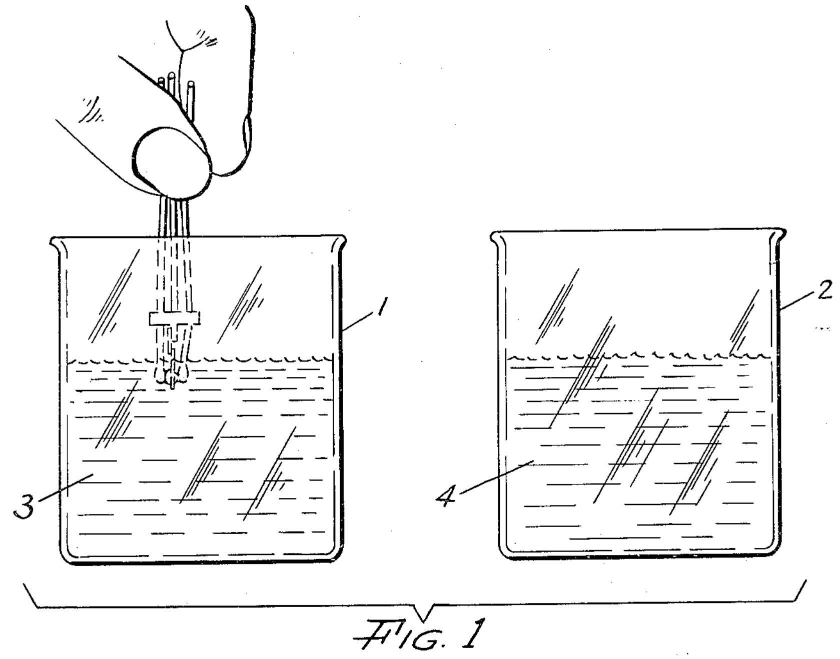
Figure 2:
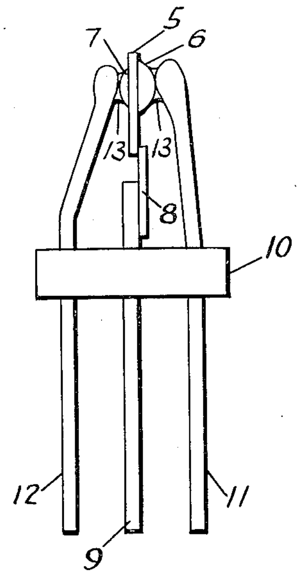

The invention will be better understood as the following description proceeds taken in conjunction with the accompanying drawing wherein:

FIG. 1 is a diagrammatic representation of the soldering process of the present invention; and FIG. 2 is a greatly enlarged side view of a semiconductive device made in accordance with the process of FIG. 1.

Referring now to the drawing and more particularly to FIG. 2 thereof, there is shown one example of a semiconductor device upon which the process of the present invention may be practiced.

In the device shown in FIG. 2, a chip 5 of suitable semiconductor material, for example, germanium, may be provided by slicing from a suitable single crystal of germanium, as is well known in the art. An emitter dot 7 and a collector dot 6 may then be fused to the chip 5. The dots 6 and 7 are of an impurity material which will alter the electrically conductive characteristic of the germanium chip 5 when the fusion process takes place and may be, for example, indium, or an alloy of indium and gold. In this instance, the device of FIG. 2 will be what is known in the art as a PNP transistor, but it should be understood that the present invention may be practiced on NPN units, the only requirement being that the impurity material used be capable of being wet by the fluxing solution which will be later described. In addition to the attachment of the dots 6 and 7, a lead 9 may be connected to the chip by a tab 8 to constitute a base connection. The chip 5 may then be mounted on a suitable stem 10 and two additional leads 11 and 12 may be run through the stem and positioned adjacent to the dots 6 and 7. The unit is now ready for connecting the leads 11 and 12 to the dots 6 and 7.

Referring now to FIG. 1, there is shown diagrammatically one arrangement of apparatus for practicing the present invention. As shown, two receptacles 1 and 2 are provided, one of which contains a melt of liquid solder 3, and the other of which contains a quantity of fluxing solution 4. The solder 3 may be any solder suitable to making metallic connections, a mixture of 50 percent tin—50 percent indium having been found useful due to low temperature considerations. The solder may be heated to a temperature of about 136° C. by suitable means not shown. In order to properly prepare the dots and leads for the soldering operation, receptacle 2 should contain a fluxing solution which will wet the surfaces of the dots and leads which are to be joined, but will not wet the surface of the chip 5. Applicant has discovered that a solution of lactic acid will accomplish this desirable action. The solution 4, contained in receptacle 2, may be about a 15 percent—25 percent solution of lactic acid in water, a particularly desirable ratio having been found to be 17.5 percent. Alternatively, it has been found that the solution 3 may be a 40 percent solution of ortho-phosphoric acid in water. Both of these agents will wet the dots and leads, but will not wet the surface of the germanium.

In accordance with the present invention, the connection of leads 11 and 12 to dots 6 and 7, respectively, may be made by simply dipping the unit into the fluxing solution contained in receptacle 2 and then dipping the unit into the solder contained in receptacle 1, as shown in FIG. 1. An excellent solder connection shown at 13 in FIG. 2 is thereby made with no solder adhering to the chip itself. After the soldering operation is completed, any excess residue may be removed by washing with water.

Although there have been described what are considered to be preferred embodiments of the present invention, various adaptations and modifications thereof may be made without departing from the spirit and scope of the invention as defined in the apended claims. For example, although the process has been described with respect to a single unit, it is obvious that any number of units may be soldered simultaneously, and that the process may be mechanized rather than manual. Also, the process may be applied to other types of semiconductive devices, for example, diodes, and is not necessarily confined to soldering transistors.

What is claimed is:

1. The method of attaching a conducting lead to electrical conductivity-type determining impurity material on a semiconductor chip, said method comprising attaching said impurity material to said chip, placing a conducting lead adjacent said impurity material to provide a unit assembly, said impurity material and said conducting lead having the property of being capable of being wet by lactic acid while said semiconductor chip is of a substance substantially incapable of being wet by lactic acid, applying a solution containing lactic acid to said assembly thereby applying lactic acid to said lead and said impurity material, and thereafter applying molten solder to said assembly whereby said solder becomes applied to said lead and said impurity material, but not to said chip.

2. The method of attaching a conducting lead to electrical conductivity-type determining impurity material on a semiconductor chip, said method comprising attaching said impurity material to said chip, placing a conducting lead adjacent said impurity material to provide a unit assembly, said impurity material and said conducting lead having the property of being capable of being wet by aqueous orthophosphoric acid while said semiconductor chip is of a substance substantially incapable of being wet by aqueous orthophosphoric acid, applying a solution containing aqueous orthophosphoric acid to said assembly thereby applying said acid to said lead and said impurity material, and thereafter applying molten solder to said assembly whereby said solder becomes applied to said lead and said impurity material, but not to said chip.

3. The method of making a semiconductor device, said method comprising providing a chip of semiconductor material which is substantially incapable of being wet by lactic acid, fusing electrical conductivity-type determining impurity material to said chip, placing conducting leads adjacent said impurity material to provide a unit assembly, said impurity material and said leads having the characteristic of being capable of being wet by lactic acid, inserting said unit assembly into lactic acid to apply said acid to said leads and said impurity material, inserting said unit assembly into a molten solder bath to apply said solder to said leads and said impurity material, and washing excess residue from said assembly.

4. The method of making a semiconductor device, said method comprising providing a chip of semiconductive material which is substantially incapable of being wet by aqueous orthophosphoric acid, fusing electrical conductivity-type determining impurity material to said chip, placing conducting leads adjacent said impurity material to provide a unit assembly, said impurity material and said leads having the characteristic of being capable of being wet by an aqueous orthophosphoric acid solution, inserting said unit assembly into an aqueous orthophosphoric acid bath to apply said acid to said leads and said impurity material, inserting said unit assembly into a molten solder bath to apply said solder to said leads and said impurity material, and washing excess residue from said assembly.

5. The method of making a semiconductor device, said method comprising providing a chip of germanium, fusing electrical conductivity-type determining impurity material to said chip, placing conducting leads adjacent said impurity material to provide a unit assembly, said impurity material and said leads having the characteristic of being capable of being wet by lactic acid, inserting said unit assembly into lactic acid to apply said acid into said leads and said impurity material, inserting said unit assembly into a molten solder bath to apply said solder to said leads and said impurity material, and washing excess residue from said assembly.

6. The method of making a semiconductor device, said method comprising providing a chip of germanium, fusing electrical conductivity-type determining impurity material to said chip, placing conducting leads adjacent said impurity material to provide a unit assembly, said impurity material and said leads having the characteristic of being capable of being wet by aqueous orthophosphoric acid, inserting said unit assembly into an aqueous orthophosphoric acid bath to apply said acid to said leads and said impurity material, inserting said unit assembly into a molten solder bath to apply said solder to said leads and said impurity material, and washing excess residue from said assembly.

7. The method of making a semiconductor device, said method comprising providing a chip of semiconductor material which is substantially incapable of being wet by aqueous orthophosphoric acid, fusing electrical conductivity-type determining impurity material to said chip, positioning conducting leads adjacent said impurity material to provide a unit assembly, said impurity material and said leads having the characteristic of being capable of being wet by an aqueous orthophosphoric acid solution, inserting said unit assembly into a substantially forty percent aqueous orthophosphoric acid solution to apply said acid to said leads and said impurity materials, inserting said unit assembly into a molten solder bath to apply said solder to said leads and said impurity material, and washing excess residue from said assembly.

References Cited in the file of this patent

UNITED STATES PATENTS

| | | |
|---|---|---|
| 1,119,781 | Feidt | Dec. 1, 1914 |
| 2,321,071 | Ehrhardt et al. | June 8, 1943 |
| 2,464,821 | Ludwick et al. | Mar. 22, 1949 |
| 2,507,780 | Gilbert | May 16, 1950 |
| 2,735,050 | Armstrong | Feb. 14, 1956 |
| 2,897,587 | Schnable | Aug. 4, 1959 |

FOREIGN PATENTS

| | | |
|---|---|---|
| 497,400 | Canada | Nov. 3, 1953 |
| 400,609 | Great Britain | Oct. 23, 1933 |
| 661,932 | Great Britain | Nov. 28, 1951 |